United States Patent
Choi et al.

(10) Patent No.: US 10,014,907 B2
(45) Date of Patent: Jul. 3, 2018

(54) INTEGRATED CIRCUIT HAVING EYE OPENING MONITOR AND SERIALIZER/DESERIALIZER DEVICE

(71) Applicants: Hwang Ho Choi, Hwasung (KR); Duho Kim, Hwasung (KR); JaeHyun Park, Hwasung (KR); Chang-Kyung Seong, Hwasung (KR)

(72) Inventors: Hwang Ho Choi, Hwasung (KR); Duho Kim, Hwasung (KR); JaeHyun Park, Hwasung (KR); Chang-Kyung Seong, Hwasung (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 127 days.

(21) Appl. No.: 14/957,969

(22) Filed: Dec. 3, 2015

(65) Prior Publication Data

US 2016/0209462 A1    Jul. 21, 2016

(30) Foreign Application Priority Data

Jan. 20, 2015    (KR) .......................... 10-2015-0009259

(51) Int. Cl.
  *G01R 31/3187*    (2006.01)
  *H04B 3/46*    (2015.01)
  *G01R 31/317*    (2006.01)

(52) U.S. Cl.
  CPC ........... *H04B 3/46* (2013.01); *G01R 31/3171* (2013.01)

(58) Field of Classification Search
  CPC .............. G01R 19/257; G01R 31/2884; G01R 31/3004; G01R 31/3181; G01R 31/31813
  See application file for complete search history.

(56) References Cited

U.S. PATENT DOCUMENTS

| | | |
|---|---|---|
| 4,449,223 A | 5/1984 | Liskov et al. |
| 6,784,653 B2 | 8/2004 | Baumert |

(Continued)

FOREIGN PATENT DOCUMENTS

KR    10-0570632 B1    4/2006

OTHER PUBLICATIONS

Seong et al., "A 10-Gb/s Adaptive Decision Feedback Equalizer with On-Chip Eye Opening Monitoring", Yonsei University, Jan. 2011, 135 pages total.

(Continued)

*Primary Examiner* — Tung X Nguyen
(74) *Attorney, Agent, or Firm* — Sughrue Mion, PLLC

(57) ABSTRACT

An integrated circuit having an eye opening monitor (EOM) is provided. The integrated circuit may include: an internal circuit; and the EOM configured to measure an eye diagram of a predetermined point of the internal circuit, wherein the EOM may include a comparator configured to receive a first and a second parent reference voltages and a first and a second input voltages output from the internal circuit, and to compare the first and second input voltages with target reference voltages corresponding to the first and second parent reference voltages, and wherein the comparator divides the target reference voltages from the first and second input voltages respectively by varying a driving capability according to size information data, and compares the first and second input voltages with divided target reference voltages.

20 Claims, 13 Drawing Sheets

(56) References Cited

U.S. PATENT DOCUMENTS

| | | |
|---|---|---|
| 7,460,589 B2 | 12/2008 | Fujimori et al. |
| 7,656,984 B2 | 2/2010 | Kim et al. |
| 7,787,536 B2 | 8/2010 | Chou |
| 8,111,784 B1* | 2/2012 | Ding .................... H04L 25/063 |
| | | 327/141 |
| 8,917,116 B2 | 12/2014 | Bae et al. |
| 2003/0025491 A1 | 2/2003 | Baumert |
| 2004/0066867 A1 | 4/2004 | Fujimori et al. |
| 2006/0008041 A1 | 1/2006 | Kim et al. |
| 2008/0019435 A1* | 1/2008 | Chou ....................... H04L 1/20 |
| | | 375/232 |
| 2014/0266318 A1* | 9/2014 | Bae ....................... H03B 21/00 |
| | | 327/105 |

OTHER PUBLICATIONS

Svelto et al., "CMOS Circuits for Serial Links Beyond 10Gb/s", Universita'Degli Studi di Pavia, Oct. 2010, 137 pages total.

\* cited by examiner

INTEGRATED CIRCUIT HAVING EYE OPENING MONITOR AND SERIALIZER/DESERIALIZER DEVICE

CROSS-REFERENCE TO RELATED APPLICATIONS

This application claims from Korean Patent Application No. 10-2015-0009259, filed Jan. 20, 2015, in the Korean Intellectual Property Office, the entire disclosure of which is incorporated herein by reference.

BACKGROUND

Apparatuses and methods consistent with exemplary embodiments relate to an integrated circuit (IC) having an eye opening monitor (EOM) and a serializer/deserializer (SERDES) device.

A fast transmission system has a problem in that a transmission rate is limited according to a limit in a bandwidth of a channel. Accordingly, an equalizer is used to compensate the limited bandwidth. Particularly, an adaptive equalizer is used to automatically and optimally compensate for various channel characteristics. Various adaptive algorithms may be applied to automatically determine an operation coefficient of an equalizer according to a channel environment. An EOM method among these adaptive algorithms is used to measure an eye diagram of a received signal in a chip and to monitor a state of the received signal.

SUMMARY

One or more exemplary embodiments provide an IC having an EOM to enhance resolution of a reference voltage and a SERDES device therefor.

According to an aspect of an exemplary embodiment there is provided an integrated circuit including an internal circuit and an eye opening monitor (EOM) configured to measure an eye diagram of a predetermined point of the internal circuit. The EOM may include a comparator configured to receive first and second parent reference voltages and first and second input voltages output from the internal circuit, and to compare the first and second input voltages with target reference voltages corresponding to the first and second parent reference voltages, wherein the comparator obtains the target reference voltages by dividing the first and second parent reference voltages respectively by varying a driving capability according to size information data, and compares the first and second input voltages with the target reference voltages.

The EOM may further include a digital to analog converter (DAC) configured to receive reference voltage data and to output the first and second parent reference voltages to the comparator.

The integrated circuit may further include a sensing amplifier configured to sample and amplify an output value of the comparator in response to a clock.

The integrated circuit may further include a counter configured to perform counting in response to an output value of the sensing amplifier.

The integrated circuit may further include a phase locked loop (PLL) configured to receive a reference clock and to generate the clock, wherein the PLL includes a phase interpolator (PI) configured to shift a phase of the clock in response to a selection bit.

The comparator may include a main branch configured to receive the first and second input voltages respectively at a first node and a second node, and a plurality of reference branches, each of which configured to provide the first and second parent reference voltages respectively to the first node and the second node.

Each of the plurality of reference branches may be enabled in response to the size information data.

The main branch and the plurality of reference branches may be configured such that an amount of current which flows in the main branch is identical to an amount of current which flows in the enabled reference branches among the plurality of reference branches.

At least two reference branches among the plurality of reference branches may be implemented with transistors of different sizes.

The comparator may include a first comparator and a second comparator, wherein each of the first comparator and the second comparator may include a main branch configured to receive the first and second input voltages respectively at a first node and a second node, and a plurality of reference branches, each of which configured to provide the first and second parent reference voltages respectively to the first node and the second node, wherein each of the plurality of reference branches may be enabled in response to the size information data, and wherein the first and second parent reference voltages input to the plurality of reference branches of the first comparator and the first and second parent reference voltages input to the plurality of reference branches of the second comparator may be complementary with each other.

Each of the first and second comparators may include a first multiplexer configured to select one of a supply voltage, a ground voltage, the first parent reference voltage, and the second parent reference voltage, and to provide the selected voltage to the plurality of reference branches, and a second multiplexer configured to select one of the supply voltage, the ground voltage, the first parent reference voltage, and the second parent reference voltage, and to provide the selected voltage to the plurality of reference branches, and wherein the voltage selected by the first multiplexer and the voltage selected by the second multiplexer may be complementary with each other.

The integrated circuit may further include a first sensing amplifier configured to sample and amplify an output value of the first comparator in response to a clock and a second sensing amplifier configured to sample and amplify an output value of the second comparator in response to the clock.

The integrated circuit may further include a logic circuit configured to exclusive OR (XOR) compute an output value of the first sensing amplifier and an output value of the second sensing amplifier, and a counter configured to count an output value of the logic circuit until the output value of the logic circuit is input as a signal with a level of a predetermined state.

The integrated circuit may further include a phase locked loop (PLL) configured to receive a reference clock and generate the clock, wherein the PLL comprises a phase interpolator (PI) configured to shift a phase of the clock in response to a selection bit.

According to an aspect of another exemplary embodiment, there is provided an integrated circuit. The integrated circuit may include a continuous time linear equalizer (CTLE) configured to amplify serial data signals, a sampler configured to sample first and second input voltages output from the CTLE, and an eye opening monitor (EOM) configured to measure an eye diagram of the first and second input voltages, wherein the EOM may include a digital to analog converter (DAC) configured to receive reference voltage data and output first and second parent reference voltages, and a comparator configured to receive the first and second parent reference voltages and first and second input voltages output from the CTLE and to compare the first and second input voltages with target reference voltages corresponding to the first and second parent reference voltages, wherein the comparator obtains the target reference voltages by dividing the first and second parent reference voltages respectively by varying its driving capability according to size information data, and compares the first and second input voltages with the target reference voltages.

The integrated circuit may further include a decision feedback equalizer (DFE) configured to connect between the CTLE and the sampler.

The integrated circuit may further include a first buffer configured to output voltages between the CTLE and the DFE as input voltages of the EOM in response to a first enable signal, and a second buffer configured to output voltages between the DFE and the sampler as input voltages of the EOM in response to a second enable signal, wherein the first enable signal and the second enable signal may be complementary with each other.

The integrated circuit may further include a clock and data recovery (CDR) circuit configured to reproduce data and a clock output from the sampler.

According to an aspect of another exemplary embodiment, there is provided a serializer/deserializer (SERDES) device. The SERDES device may include a receiver configured to receive reception signals and to output parallel reception data in response to a clock, a transmitter configured to receive parallel transmission data in response to the clock and to output transmission signals, and a phase locked loop (PLL) configured to receive a reference clock and generate the clock, wherein the receiver may include an eye opening monitor (EOM) configured to detect waveforms of the reception signals, wherein the EOM may include a digital to analog converter (DAC) configured to receive reference voltage data and output first and second parent reference voltages and a comparator configured to receive the first and second parent reference voltages and first and second input voltages and to compare the first and second input voltages with target reference voltages corresponding to the first and second parent reference voltages, wherein the comparator obtains the target reference voltages 1a dividing the first and second parent reference voltages respectively by varying a driving capability according to size information data, and compares the first and second input voltages with the target reference voltages.

The receiver may further include an analog front end (AFE) circuit configured to receive and amplify the reception signals, a decision feedback equalizer (DFE) configured to equalize output signals of the AFE circuit, a clock and data recovery (CDR) circuit configured to reproduce data and a clock output from the DFE, and a deserializer (DES) configured to receive the data and output the parallel reception data in response to the clock.

The PLL may include a phase interpolator (PI) configured to shift a phase of the clock in response to a selection bit.

The PLL may include a sigma-delta modulator (SDM) configured to receive a selection bit and to dither the selection bit and a PI configured to shift a phase of the clock in response to the dithered selection bit.

The SERDES device may further include a sensing amplifier configured to sample and amplify an output value of the comparator in response to the clock and a counter configured to count an output value of the sensing amplifier until the output value of the sensing amplifier is input as a signal with a level of a predetermined state.

According to an aspect of another exemplary embodiment, there is provided a method of measuring an eye diagram of an eye opening monitor (EOM). The method may include receiving reference voltage data and size information data, generating first and second parent reference voltages in response to the reference voltage data and setting a size of a comparator according to the size information data to divide the first and second parent reference voltages, and comparing first and second input voltages with the divided first and second parent reference voltages at the set comparator and counting a compared result value during a certain time until the compared result value is output as a signal with a level of a predetermined state.

The reference voltage data and the size information data may be input manually from the outside.

The reference voltage data and the size information data may be input automatically from the outside.

According to an aspect of another exemplary embodiment, there is provided a method of measuring an eye diagram of an eye opening monitor (EOM). The method may include receiving reference voltage data, size information data, and a selection bit, generating first and second parent reference voltages in response to the reference voltage data, setting a size of a first comparator and a second comparator according to the size information data, and setting a phase shift of a clock according to the selection bit, and comparing first and second input voltages with the first and second parent reference voltages at the first and second comparators and counting compared result value during a certain time until the compared result value is output as a signal with a level of a predetermined state.

The reference voltage data, the size information data, and the selection bit may be input manually from the outside.

The reference voltage data, the size information data, and the selection bit may be input automatically from the outside.

BRIEF DESCRIPTION OF THE DRAWINGS

The above and/or other aspects will become apparent from the following description with reference to the following drawings, in which.

DETAILED DESCRIPTION OF THE EXEMPLARY EMBODIMENTS

Exemplary embodiments will be described clearly and in detail with reference to the accompanying drawings.

Various modifications and several shapes are possible in various exemplary embodiments and specific exemplary embodiments are illustrated in drawings and related detailed descriptions are listed. However, the inventive concept is not intended to be limited to the specific exemplary embodiments, and it is understood that it should include all modifications, equivalents, and substitutes within the scope and technical range of the inventive concept. It will be understood that, although the terms such as "1st", "2nd", "first", "second", and the like may be used herein to describe various elements, the elements should not be limited by these terms. These terms are used to distinguish one element from another element. For example, a first element may be referred to as a second element and vice versa without departing from the scope of the exemplary embodiments. It will be understood that when an element is referred to as being "connected to" or "coupled to" another element, it may be directly connected or coupled to the other element, or intervening elements may be present. In contrast, when an element is referred to as being "directly connected to" or "directly coupled to" another element, it should be understood that there are no intervening elements. Other expressions for expressing relations between elements, such as "between" and "directly between" or "adjacent to" and "directly adjacent to", should be also interpreted.

Terms used herein are for the purpose of describing particular exemplary embodiments only and are not intended to limit the scope of the inventive concept. As used herein, the singular forms "a", "an" and "the" are intended to include the plural forms as well, unless the context clearly indicates otherwise. It should be understood that the terms "include", "comprise", "have", "including", "comprising", and/or "having" used herein specify the presence of stated features, integers, steps, operations, elements, components, and/or combinations thereof but do not preclude the presence of addition of one or more other features, integers, steps, operations, elements, components, and/or combinations thereof. Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal detect unless expressly so defined herein.

Figure 1:
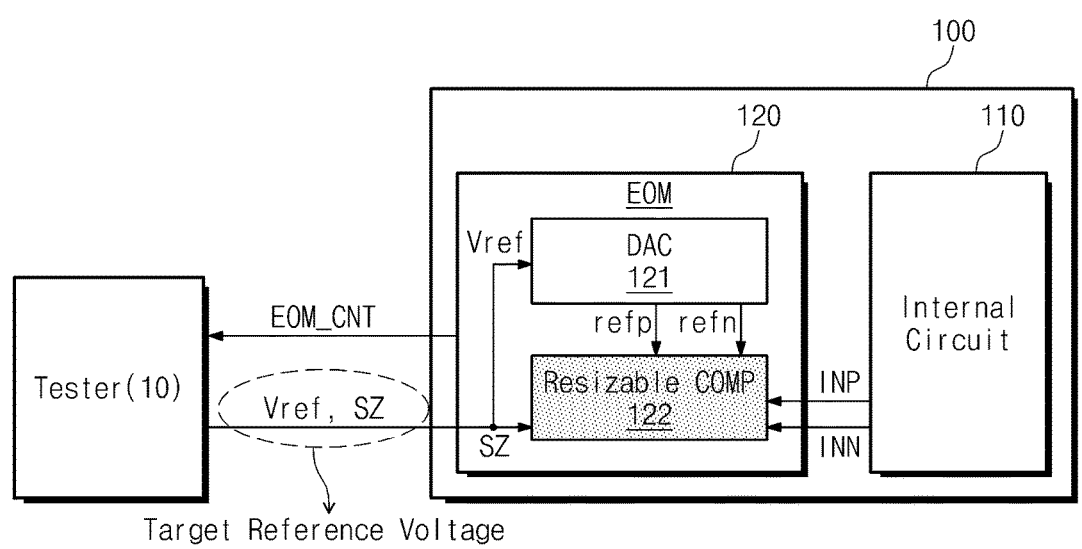
FIG. 1 is a block diagram illustrating a concept according to an exemplary embodiment.

FIG. 1 is a block diagram illustrating a concept according to an exemplary embodiment. Referring to FIG. 1, an integrated circuit (IC) 100 may include an internal circuit 110 and an eye opening monitor (EOM) 120. The EOM 120 may measure an eye diagram of at least one of signal lines of the internal circuit 110.

The EOM 120 may be implemented to compare target reference voltages corresponding to complementary parent reference voltages refp and refn with complementary input voltages INP and INN to measure an eye diagram of a predetermined point of the internal circuit 110. The EOM 120 may include a digital to analog converter (DAC) 121 and a resizable comparator 122. The DAC 121 may receive reference voltage data Vref and generate the first and second parent reference voltages refp and refn corresponding to the received reference voltage data Vref.

The resizable comparator 122 may receive the first and second parent reference voltages refp and refn and the first and second input voltages INP and INN, and compare the first and second input voltages INP and INN with target reference voltages. Wherein the target reference voltages are obtained by dividing the first and second parent reference voltages respectively by varying a driving capability according to size information data SZ. In an exemplary embodiment, the first and second input voltages INP and INN may be voltages of predetermined points of the internal circuit 110, which are for measuring an eye diagram.

The resizable comparator 122 according to an exemplary embodiment may vary, regulate, adjust, modify, change, or control its driving capability in response to the size information data SZ. Herein, the driving capability may be associated with a size of a current sink. The variation of the driving capability may provide a similar effect to actually subdividing the first and second reference voltages refp and refn. In an exemplary embodiment, the size information data SZ may be input from an external tester 10.

A method of measuring an eye diagram is as follows. The tester 10 may transmit the reference voltage data Vref corresponding to target reference voltages and the size information data SZ to the EOM 120. In other words, the target reference voltages may be voltages for varying the driving capability of the resizable comparator 122 according to the size information data SZ and dividing the first and second parent reference voltages refp and refn according to the varied result. The EOM 120 may generate the first and second parent reference voltages refp and refn corresponding to the reference voltage data Vref, divide the first and second parent reference voltages refp and refn by setting the driving capability of the resizable comparator 122 according to the size information data SZ, compare the first and second input voltages INP and INN with the divided first and second parent reference voltages at the resizable comparator 122, count the compared result value during a certain time, and output the counted result value EOM_CNT. The counted result value EOM_CNT may be a value in which the compared result value of the resizable comparator 122 is sampled in response to a clock.

In an exemplary embodiment, the reference voltage data Vref and the size information data SZ may be input manually or automatically from the outside.

A conventional EOM may not avoid increasing a size of a DAC to enhance resolution of a reference voltage. There is an issue of increasing a chip size of an IC due to increasing the size of the DAC. On the other hand, in an exemplary embodiment, the EOM 120 may enhance the resolution of the reference voltage of the eye diagram without increasing a chip size by varying the driving capability of the resizable comparator 122.

Figure 2:
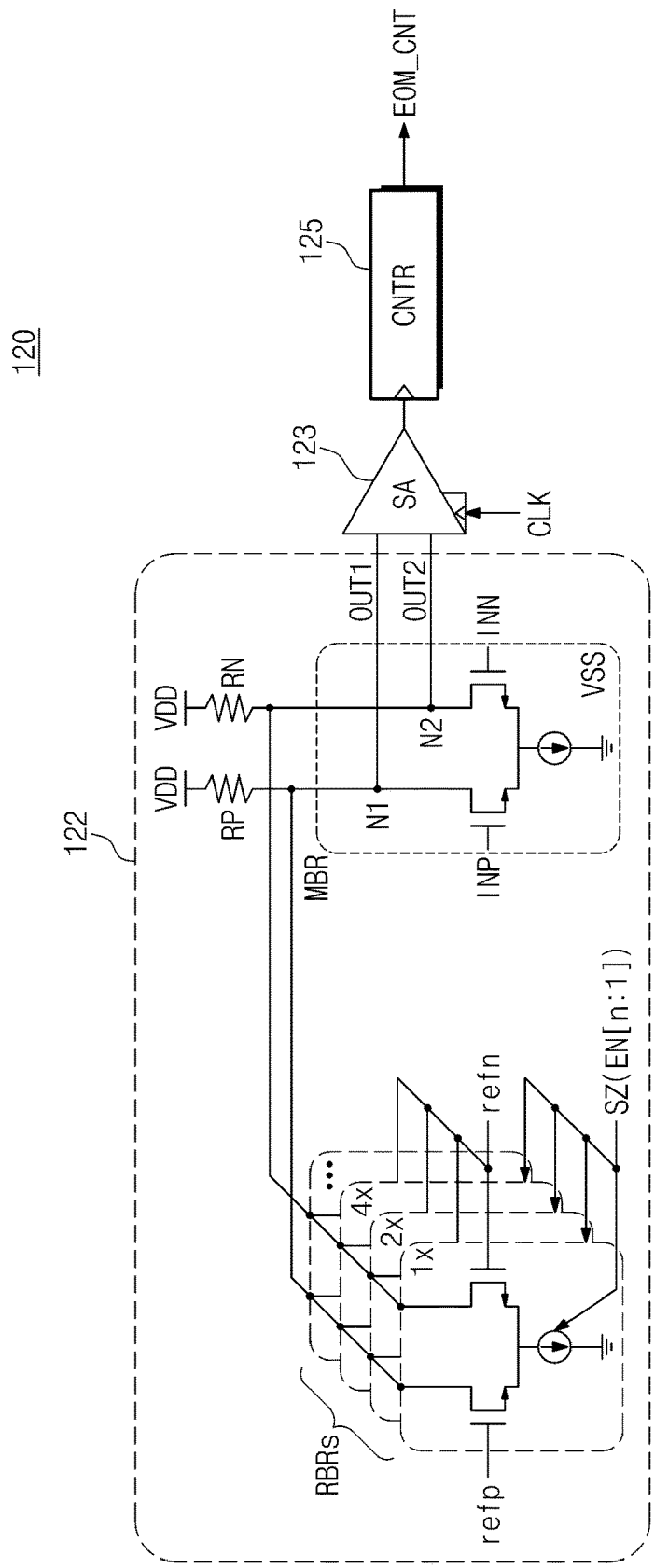
FIG. 2 is a circuit diagram illustrating a configuration of an eye opening monitor (EOM) according to an exemplary embodiment.

FIG. 2 is a circuit diagram illustrating a configuration of an EOM according to an exemplary embodiment. Referring to FIG. 2, an EOM 120 may include a DAC 121 of FIG. 1, a comparator 122, a sensing amplifier 123, and a counter 125.

The DAC 121 may receive reference voltage data Vref of FIG. 1 and generate first and second parent reference voltages refp and refn of FIG. 1. Herein, the reference voltage data Vref may be a digital value input from the outside.

The comparator 122 may include a main branch MBR which receives first and second input voltages INP and INN respectively at a first node N1 and a second node N2 and reference branches RBRs, each of which provides the first and second parent reference voltages refp and refn respectively to the first node N1 and the second node N2. In an exemplary embodiment, the main branch MBR and each of the reference branches RBRs may be current mirrors (or current sinks). One ends of the current mirrors may connect in common to the first node N1 and the other ends of the current mirrors may connect in common to the second node N2. A first resistor RP may be connected between a power terminal VDD and the first node N1, and a second resistor RN may be connected between the power terminal VDD and the second node N2.

In an exemplary embodiment, each of current sources of the reference branches RBRs may be enabled or disabled according to size information data SZ (En[n:1]) to vary driving capability of the comparator 122. A target reference voltage may be determined according to the varied driving capability of the comparator 122.

In an exemplary embodiment, sizes of transistors constituting at least two of the reference branches RBRs may differ from each other in size. For example, the transistors may differ from each other in width. As shown in FIG. 2, sizes of the reference branches RBRs may be implemented with multiples (1×, 2×, 4×, and the like) of 2.

In an exemplary embodiment, an amount of current which flows in the main branch MBR may be identical to all amount of current of enabled (or turned-on) reference branches RBRs. If all the reference branches RBRs are disabled and the first and second parent reference voltages refp and refn are input to each of the reference branches RBRs, an output (OUT1–OUT2) of the comparator 122 may be (INP–INN)–(refp–refn). Herein, a target reference voltage of the comparator 122 may be (refp–refn). When the reference branches RBRs are enabled such that a half amount of current flows in the reference branches RBRs, in comparison with an entire amount of current which flows in all the reference branches RBRs when all the reference branches RBRs are enabled, and the first and second parent reference voltages refp and refn are input to each of the reference branches RBRs, the target reference voltage of the comparator 122 may be (refp–refn)/2. The resolution of a reference voltage may be enhanced by this method.

The sensing amplifier 123 may amplify and output the output (OUT1–OUT2) of the comparator 122, that is, difference between the first output voltage OUT1 of the first node N1 and the second output voltage OUT2 of the second node N2, in response to a clock CLK. In other words, the output (OUT1–OUT2) of the comparator 122 may be sampled in response to the clock CLK.

The counter 125 may count an output value of the sensing amplifier 123 during a certain time in response to the output value of the sensing amplifier 123. The counter 125 may output the counted value EOM_CNT.

The EOM 120 according to an exemplary embodiment may obtain an effect of more minutely adjusting the resolution of the reference voltage (refp–refn) by including the comparator 122 which adjusts the driving capability of the reference branches RBRs in response to the size information data SZ.

On the other hand, the comparator 122 shown in FIG. 2 must sweep the reference voltage (refp–refn) from a "minus (–) maximum value" to a "plus (+) maximum value" to measure an eye diagram. However, an exemplary embodiment may be implemented with two comparators which sweep the reference voltage (refp–refn) from "0" to a "plus (+) maximum value".

Figure 3:
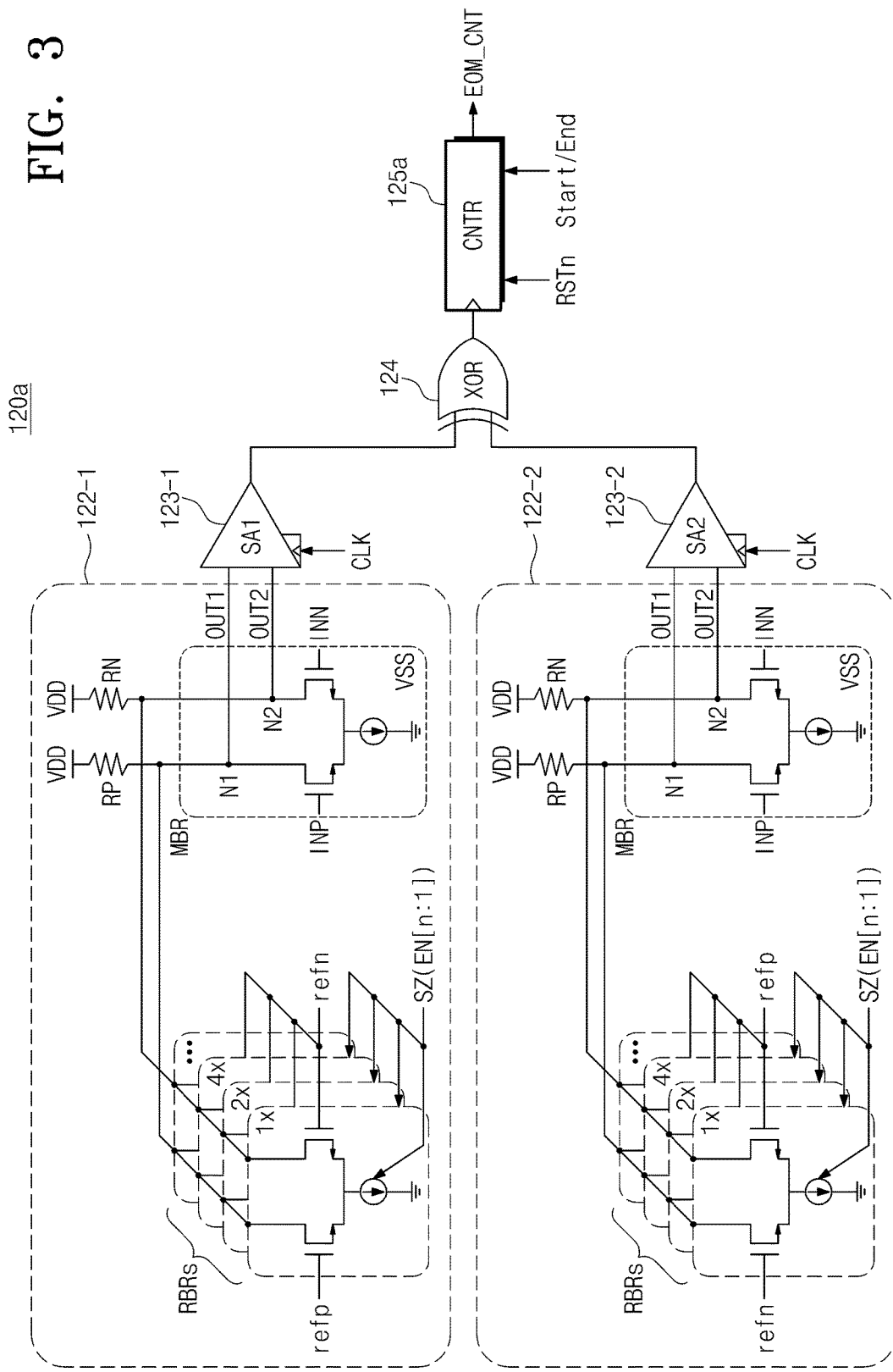
FIG. 3 is a circuit diagram illustrating a configuration of an EOM according to another exemplary embodiment.

FIG. 3 is a circuit diagram illustrating a configuration of an EOM according to another exemplary embodiment. Referring to FIG. 3, an EOM 120a may include a first comparator 122-1, a second comparator 122-2, a first sensing amplifier 123-1, a second sensing amplifier 123-2, a logic circuit 124, and a counter 125a.

The first comparator 122-1 and the second comparator 122-2 may have the same structure of a comparator 122 shown in FIG. 2. The first comparator 122-1 and the second comparator 122-2 may be identical to each other, other than that positions which receive first and second parent reference voltages refp and refn are different from each other. Herein, although not illustrated, the first and second parent reference voltages refp and refn may be generated from a DAC.

The first sensing amplifier 123-1 may sample an output value of the first comparator 122-1 in response to a clock CLK. The second sensing amplifier 123-2 may sample an output value of the second comparator 122-2 in response to the clock CLK. The logic circuit 124 may exclusive OR (XOR) compute an output value of the first sensing amplifier 123-1 and an output value of the second sensing amplifier 123-2. The counter 125a may output eye diagram data EOM_CNT by counting an output value of the logic circuit 124 during a certain time. The counter 125a may be reset in response to a reset signal RSTn, and may start or end counting in response to a start/end signal Start/End.

The EOM 120a shown in FIG. 3 may sweep a target reference voltage (refp–refn) from "0" to a "plus (+) maximum value" to obtain an eye diagram by including the first and second comparators 122-1 and 122-2 which receive the first and second parent reference voltages refp and refn complementarily (or oppositely).

The first and second comparators 122-1 and 122-2 shown in FIG. 3 may oppositely receive the first and second parent reference voltages refp and refn. For this, the EOM may include multiplexers, each of which selects one of input voltages of the reference branches RBRs according to an exemplary embodiment.

Figure 4:
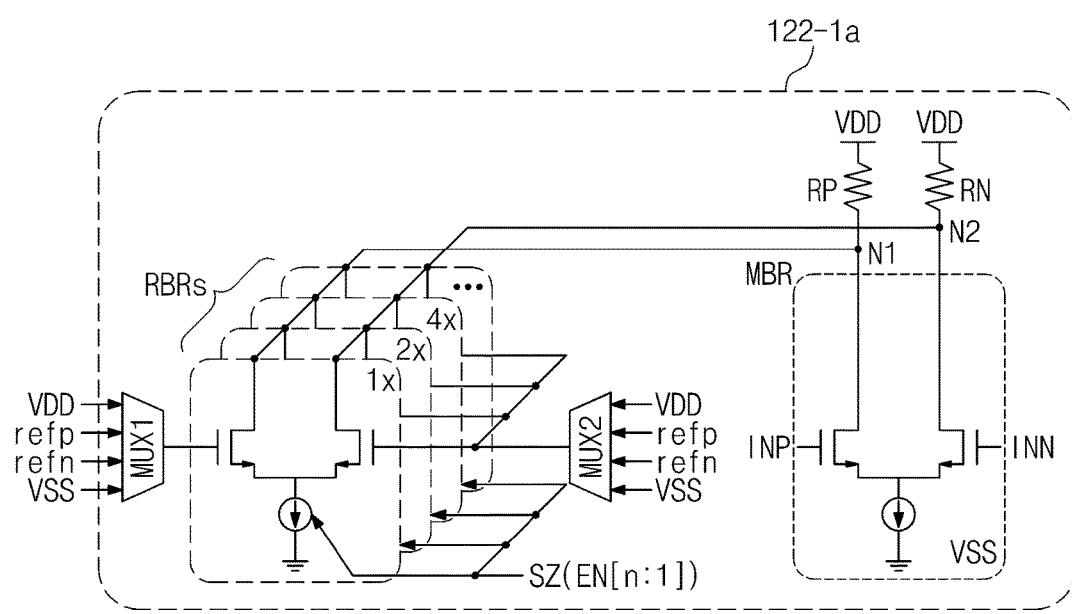
FIG. 4 is a circuit diagram illustrating a configuration of a comparator of FIG. 3 according to another exemplary embodiment.

FIG. 4 is a circuit diagram illustrating a configuration of a comparator of FIG. 3 according to another exemplary embodiment. Referring to FIG. 4, a comparator 122-1a may further include a first multiplexer MUX1 and a second multiplexer MUX2 in comparison with a first comparator 122-1 shown in FIG. 3. Each of the first and second multiplexers MUX1 and MUX2 may select one of a supply voltage VDD, a first parent reference voltage refp, a second parent reference voltage refn, and a ground voltage Vss, and may provide the selected voltage to corresponding one of reference branches RBRs. In an exemplary embodiment, the first multiplexer MUX1 and the second multiplexer MUX2 may be implemented to select complementary voltages. For example, if the first multiplexer MUX1 selects the first parent reference voltage refp, the second multiplexer MUX2 may select the second parent reference voltage refn.

While the description is given of the EOM for enhancing the resolution of the reference voltage (refp−refn) by varying the size of the comparator with reference to FIGS. 2 to 4, the scope and spirit of the inventive concept may not be limited thereto. For example, the EOM may be implemented with further including a phase locked loop (PLL) for enhancing the resolution of phase shift of a sampling clock.

Figure 5:
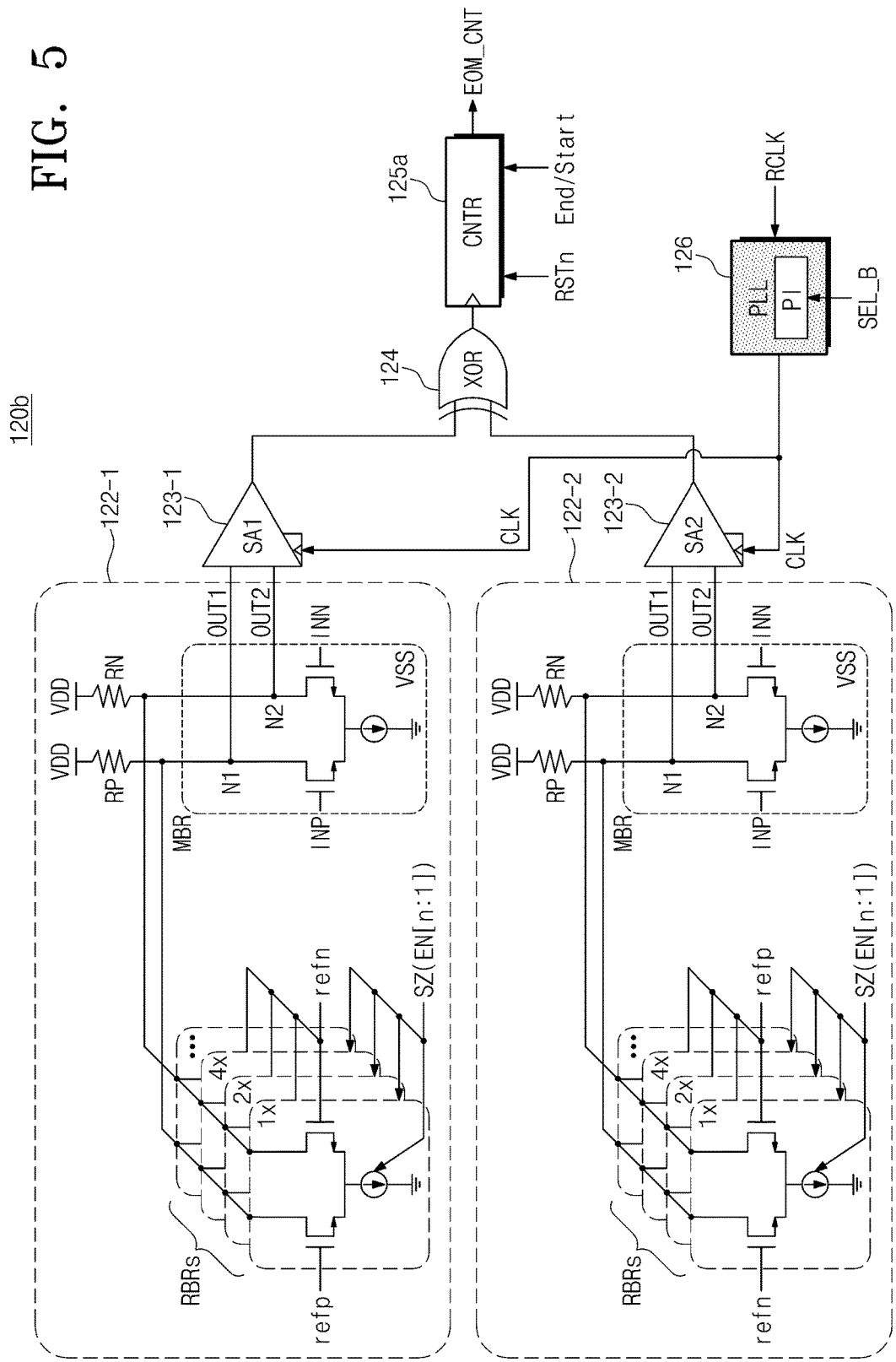
FIG. 5 is a circuit diagram illustrating a configuration of an EOM according to another exemplary embodiment.

FIG. 5 is a circuit diagram illustrating a configuration of an EOM according to another exemplary embodiment. Referring to FIG. 5, an EOM 120b may further include a PLL 126 for generating a sampling clock in comparison with an EOM 120a shown in FIG. 3. The PLL 126 may receive a reference clock RCLK and generate the sampling clock CLK. The PLL 126 may vary a phase of the sampling clock CLK in response to a selection bit SEL_B. The PLL 126 may include a phase interpolator (PI) for performing a phase shift of the sampling clock CLK in response to the selection bit SEL_B.

FIGS. 6 to 12 illustrate exemplary embodiments to which an EOM is applied.

Figure 6:
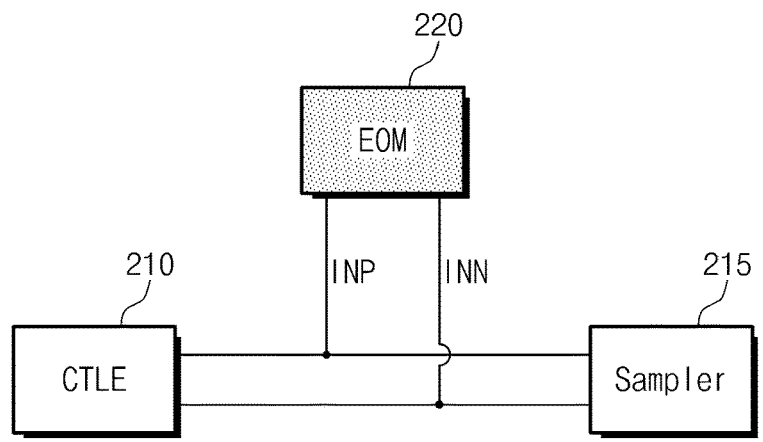
FIG. 6 is a block diagram illustrating a configuration of an integrated circuit (IC) having an embedded EOM according to an exemplary embodiment.

FIG. 6 is a block diagram illustrating a configuration of an integrated circuit (IC) having an embedded EOM according to an exemplary embodiment. Referring to FIG. 6, an IC 200 may include an EOM 220 which detects an eye diagram of signal lines between a continuous time linear equalizer (CTLE) 210 and a sampler 215. The CTLE 210 may amplify and train serial data signals. The CTLE 210 may include a variable gain amplifier which inputs an automatic gain control coefficient (AGCC) and a frequency peaking amplifier which inputs a CTLE peak. In an exemplary embodiment, the AGCC may be generated using an output value of the EOM 220. The sampler 215 may receive output signals of the CTLE 210 and sample corresponding data and errors.

The IC according to an exemplary embodiment may further include a decision feedback equalizer (DFE) which is added to a rear end of the CTLE to reduce inter-symbol interference (ISI).

Figure 7:
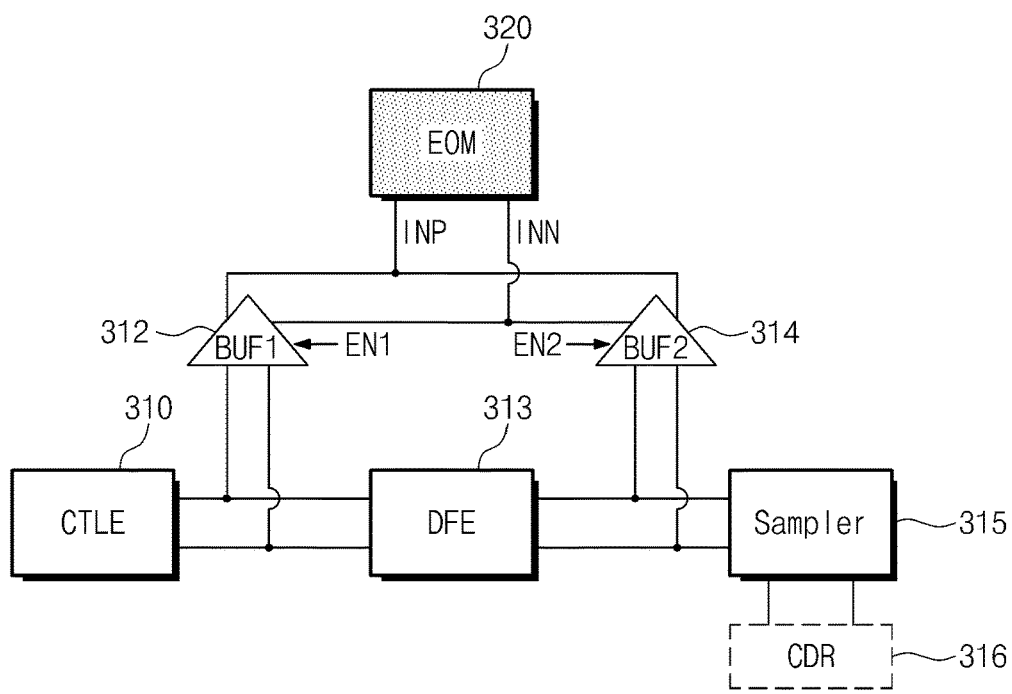
FIG. 7 is a block diagram illustrating a configuration of an IC having an embedded EOM according to another exemplary embodiment.

FIG. 7 is a block diagram illustrating a configuration of an IC having an embedded EOM according to another exemplary embodiment. Referring to FIG. 7, an IC 300 may include a CTLE 310, a DFE 313, a sampler 315, and an EOM 320. The IC 300 may further include a first buffer 312 and a second buffer 314 for sharing the EOM 320 and the DFE 313, in comparison with an IC 200 shown in FIG. 6.

The first buffer 312 may output voltages of signal lines between the CTLE 310 and the DFE 313 as input voltages INP and INN of the EOM 320 in response to a first enable signal EN1. The second buffer 314 may output voltages of signal lines between the DFE 313 and the sampler 315 as input voltages INP and INN of the EOM 320 in response to a second enable signal EN2. In an exemplary embodiment, the first enable signal EN1 and the second enable signal EN2 may be complementary signals.

The IC 300 according to an exemplary embodiment may optionally include a clock and data recovery (CDR) circuit 316 in a rear end of the sampler 315. Herein, the CDR circuit 316 may receive an output of the sampler 315 and reproduce data and a clock to compensate an edge of a data signal and ISI between data samples.

The EOM according to exemplary embodiments may be applied to a serializer/deserializer (SERDES) device.

Figure 8:
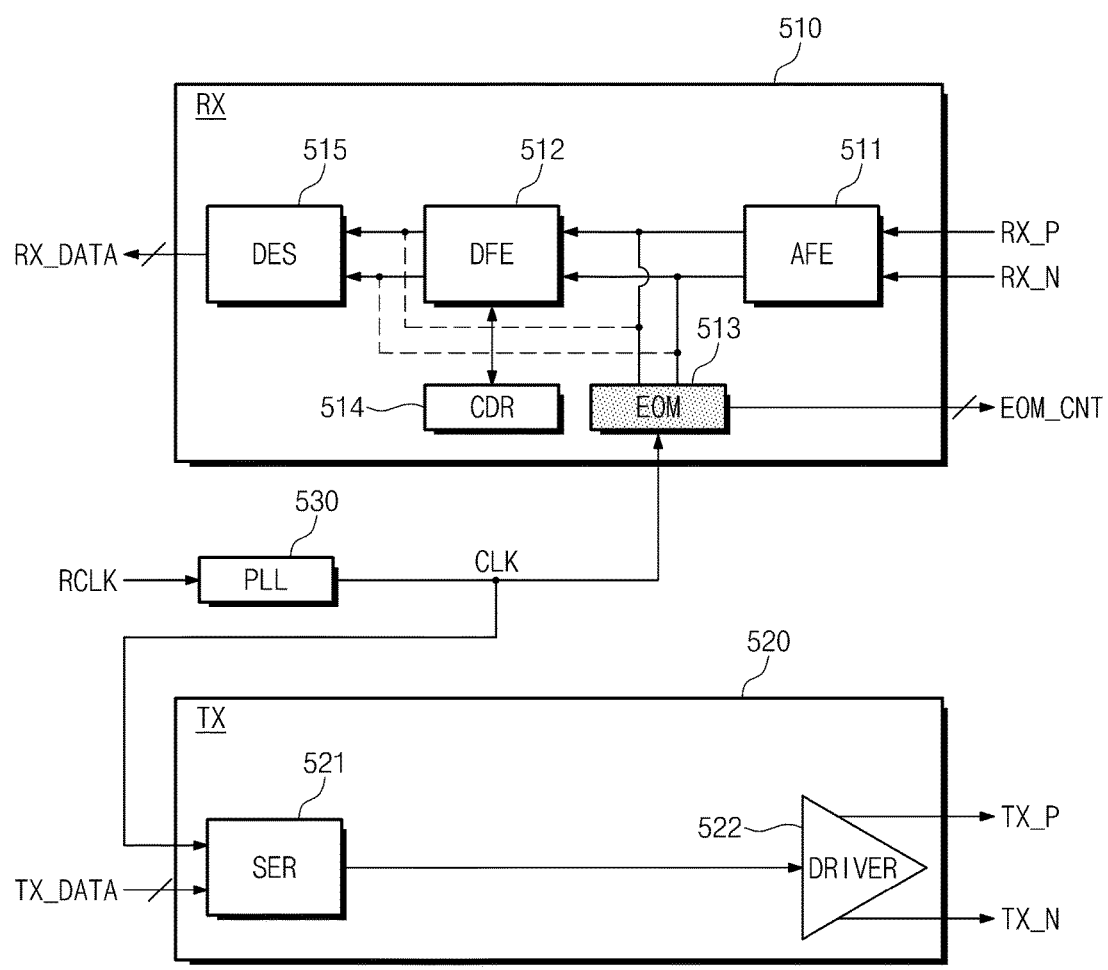
FIG. 8 is a block diagram illustrating a configuration of a serializer/deserializer (SERDES) device according to an exemplary embodiment.

FIG. 8 is a block diagram illustrating a configuration of a SERDES device according to an exemplary embodiment. Referring to FIG. 8, a SERDES device 500 may include a receiver 510, a transmitter 520, and a PLL 530.

The receiver 510 may include an analog front end (AFE) circuit 511, a DFE 512, a CDR circuit 514, and a deserializer (DES) 515. The AFE circuit 511 may receive analog data signals RX_P and RX_N and convert the received analog data signals RX_P and RX_N into digital signals which may be processed in an internal signal processing unit. The DFE 512 may equalize the digital signals output from the AFE circuit 511 using an equalization coefficient. Herein, the equalization coefficient may be determined according to output values of the EOM 513 which monitors output waveforms of the AFE circuit 511. A connection position of the EOM 513 may not be limited to a position shown in FIG. 8. In an exemplary embodiment, as shown in FIGS. 1 to 7, the EOM 513 may generate the target reference voltage (refp−refn). The CDR circuit 514 may recover output data and clocks of the DFE 512. The DES 515 may receive an output value of the DFE 512 in series and generate parallel reception data RX_DATA.

The transmitter 520 may include a serializer (SER) 521 and an output driver 522. The SER 521 may receive parallel transmission data TX_DATA and a clock CLK and convert the received parallel transmission data TX_DATA into serial transmission data. The output driver 522 may receive the serial transmission data output from the SER 521, and amplify and output the received serial transmission data as analog serial transmission signals TX_P and TX_N.

The PLL 530 may receive a reference clock RCLK and generate a clock CLK to be used in the receiver 510 and the transmitter 520. The EOM 513 according to an exemplary embodiment may use the clock CLK output from the PLL 530.

The SERDES device according to an exemplary embodiment may further include a phase interpolator (PI) in the PLL to enhance resolution of a phase shift of the clock CLK.

Figure 9:
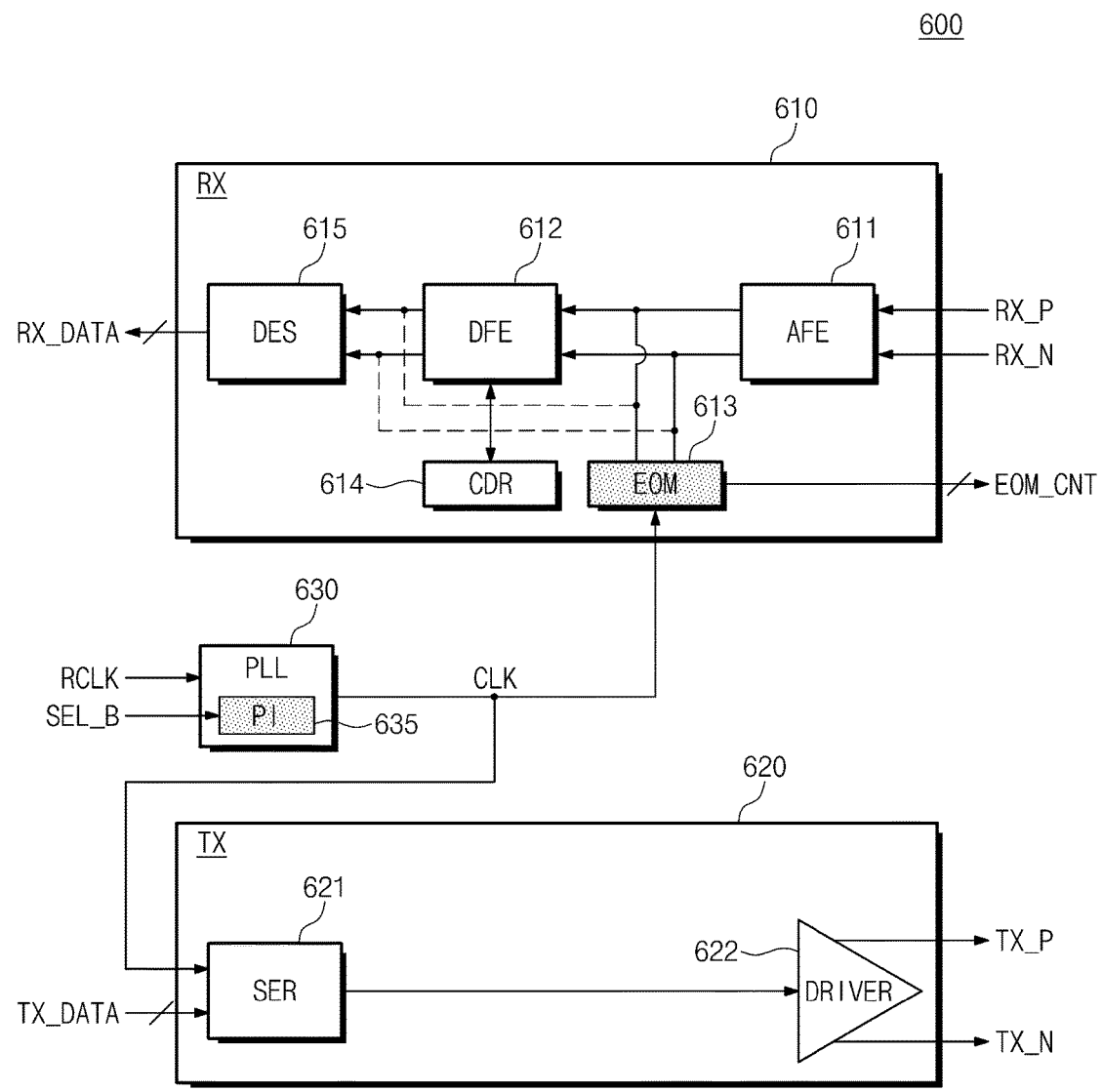
FIG. 9 is a block diagram illustrating a configuration of a SERDES device according to another exemplary embodiment.

FIG. 9 is a block diagram illustrating a configuration of a SERDES device according to another exemplary embodiment. Referring to FIG. 9, a SERDES device 600 may include a receiver 610, a transmitter 620, and a PLL 630. The receiver 610 may include an AFE circuit 611, a DFE 612, an EOM 613, a CDR circuit 614, and a DES 615. The transmitter 620 may include an SER 621 and an output driver 622.

The PLL 630 according to an exemplary embodiment o may further include a PI 635 which shifts a phase of a reference clock RCLK in response to a selection bit SEL_B, in comparison with a PLL 530 shown in FIG. 8.

Figure 10:
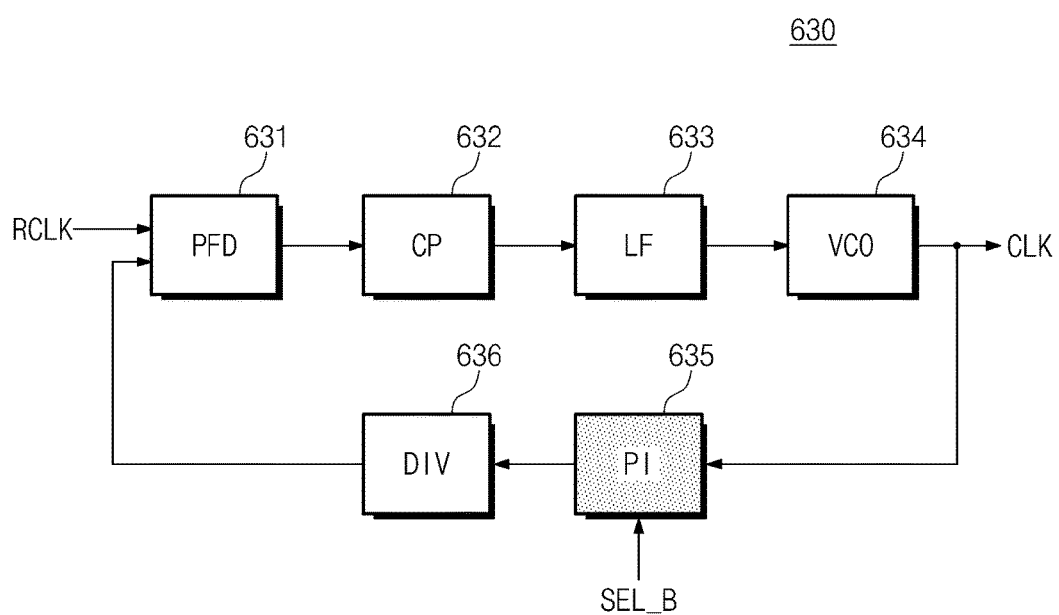
FIG. 10 is a block diagram illustrating a detailed configuration of a phase locked loop (PLL) of FIG. 9 according to an exemplary embodiment.

FIG. 10 is a block diagram illustrating a detailed configuration of a PLL of FIG. 9 according to an exemplary embodiment. Referring to FIG. 10, a PLL 630 may include a phase frequency detector (PFD) 631, a charge pump (CP) 632, a loop filter (LF) 633, a voltage controlled oscillator (VCO) 634, a PI 635, and a divider (DIV) 636.

The PFD 631 may receive a reference clock RCLK and a divided clock, and detect a phase between the reference clock RCLK and the divided clock. The CP 632 may generate voltage by the detected phase. The LF 633 may remove a high frequency component by filtering an output voltage of the CP 632 to generate a control voltage. The VCO 634 may output a clock CLK proportional to the control voltage. The PI 635 may shift a phase of the clock CLK in response to a selection bit SEL_B. The DIV 636 may receive the shifted clock of the PI 635, and generate the divided clock by dividing a frequency of the shifted clock at a predetermined rate.

The PLL 630 according to an exemplary embodiment may include the PI 635 to shift the phase of the clock CLK necessary for an EOM 613 of FIG. 9. Accordingly, because it is unnecessary to design a separate PI for the EOM, a chip size may be reduced.

The PI 635 of the PLL 630 shown in FIG. 9 may directly receive the selection bit SEL_B from the outside. However, the scope and spirit of the inventive concept may not be limited thereto. For example, the PI 635 according to an exemplary embodiment may further include a sigma-delta modulator (SDM) which may dither the selection bit SEL_B and receive the dithered signal.

Figure 11:
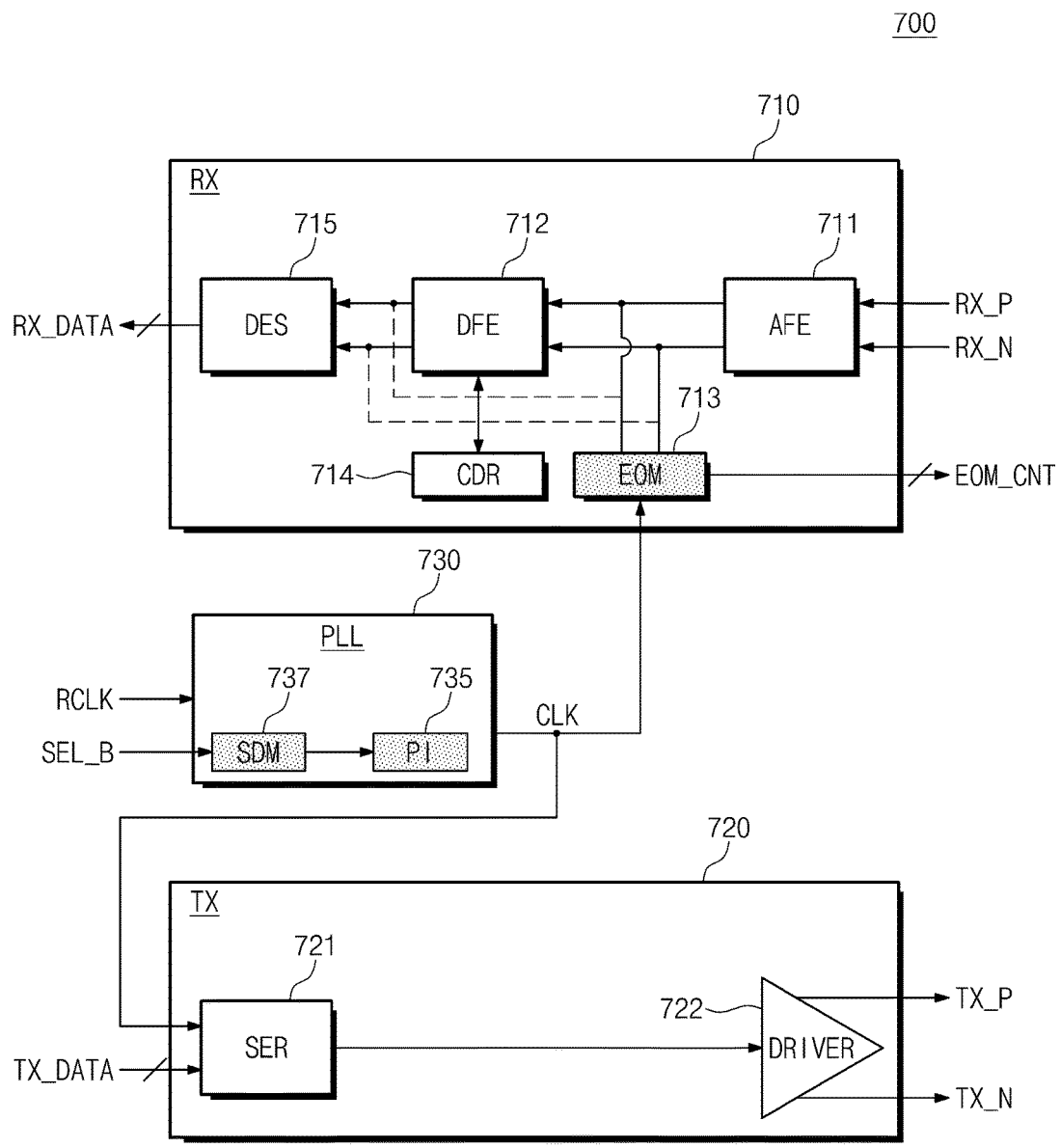
FIG. 11 is a block diagram illustrating a configuration of a SERDES device according to another exemplary embodiment.

FIG. 11 is a block diagram illustrating a configuration of a SERDES device according to another exemplary embodiment. Referring to FIG. 11, a SERDES device 700 may include a receiver 710, a transmitter 720, and a PLL 730. The receiver 710 may include an AFE circuit 711, a DFE 712, an EOM 713, a CDR circuit 714, and a DES 715. The transmitter 720 may include an SER 721 and an output driver 722.

The PLL 730 according to an exemplary embodiment may further include an SDM 737 which inputs a dithered selection bit SEL_B to a PI 735, in comparison with a PLL 630 shown in FIG. 9.

Figure 12:
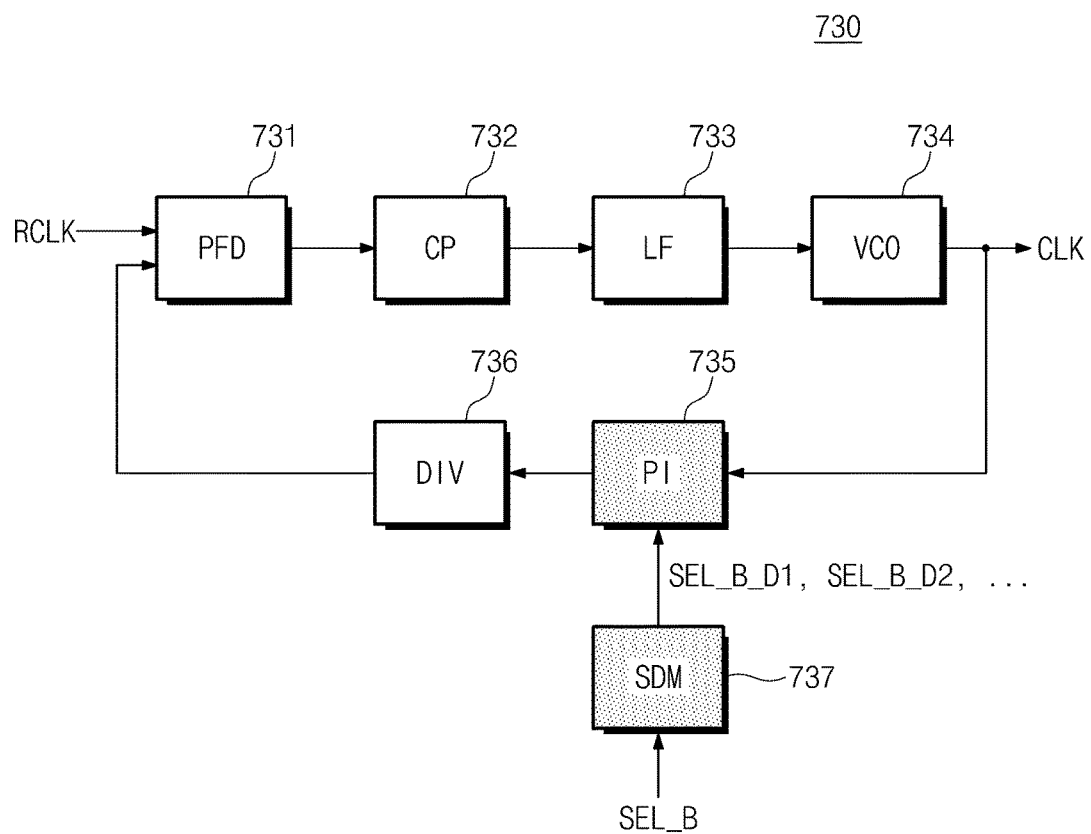
FIG. 12 is a block diagram illustrating a detailed configuration of a PLL of FIG. 11 according to another exemplary embodiment.

FIG. 12 is a block diagram illustrating a detailed configuration of a PLL of FIG. 11 according to another exemplary embodiment. Referring to FIG. 12, a PLL 730 may include a PFD 731, a CP 732, an LF 733, a VCO 734, a PI 735, a DIV 736, and an SDM 737. The SDM 737 may dither a selection bit SEL_B according to a predetermined value to generate the dithered selection bits SEL_B_D1, SEL_B_D2, and the like.

Therefore, the resolution of a phase shift of a clock used in an EOM 713 (refer to FIG. 11) may be determined as a value in which its own minimum phase degree of the PI 735 is divided by a dithered degree of the SDM 737. Accordingly, the resolution of the phase shift according to an exemplary embodiment may be remarkably enhanced in comparison with conventional resolution of phase shift.

Figure 13:
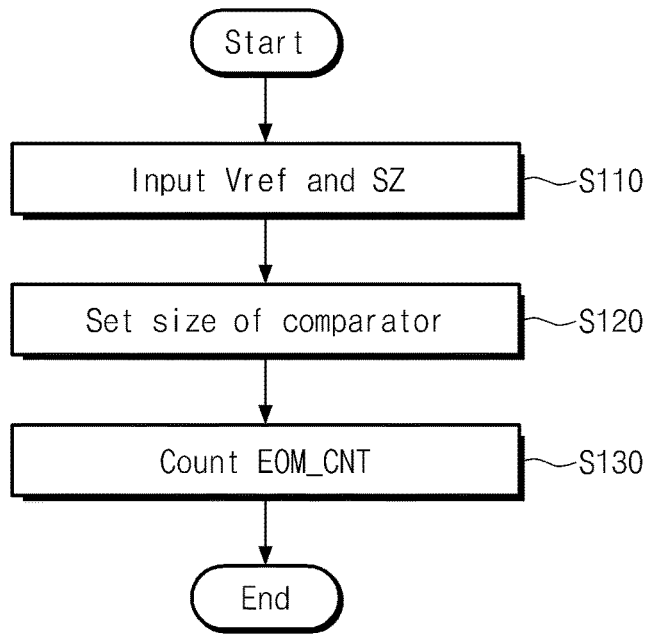
FIG. 13 is a flowchart illustrating an operation method of an EOM according to an exemplary embodiment.

FIG. 13 is a flowchart illustrating an operation method of an EOM according to an exemplary embodiment. Referring to FIGS. 1 to 13, an operation method of an EOM may be as follows.

In step S110, an EOM 120 (refer to FIG. 1) may receive reference voltage data Vref and size information data SZ (refer to FIG. 1). A DAC 121 (refer to FIG. 1) of the EOM 120 may receive the reference voltage data Vref and generate first and second parent reference voltages refp and refn. Turning on/off of reference branches RBRs of a comparator 122 (refer to FIG. 2) is determined according to the size information data SZ. Accordingly, in step S120, a size of the comparator 122 may be set. Herein, a value into which difference (refp−refn) between the first and second parent reference voltages is divided to correspond to enabled reference branches RBRs may be a target reference voltage of the comparator 122. The comparator 122 may compare an input voltage (INP−INN) of the main branch MBR with a target reference voltage output from each of the reference branches RBRs. A sensing amplifier 123 (refer to FIG. 2) may sample the compared result value in response to a clock CLK. In step S130, a counter 125 (refer to FIG. 2) may count the sample signal until the sampled signal is output, and output the counted value EOM_CNT.

In the operation method of the EOM according to an exemplary embodiment, resolution of the reference voltage may be enhanced by varying the size of the comparator 122.

Figure 14:
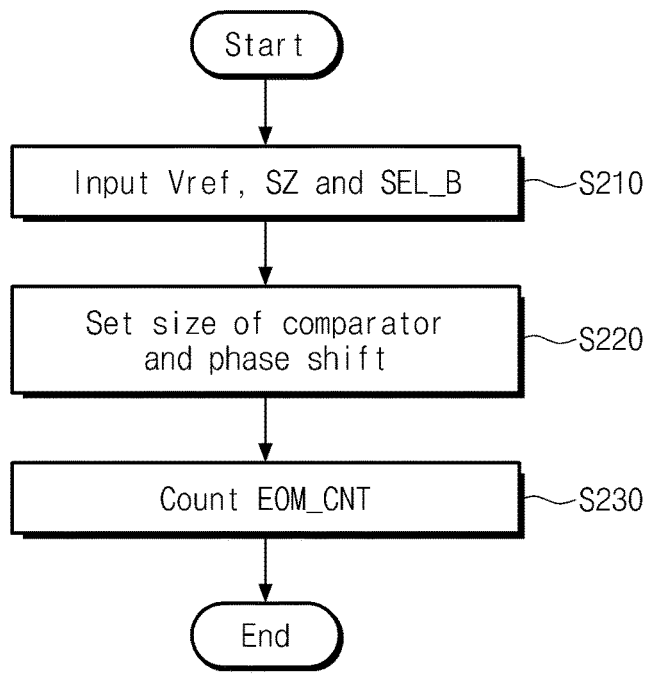
FIG. 14 is a flowchart illustrating an operation method of an EOM according to another exemplary embodiment.

FIG. 14 is a flowchart illustrating an operation method of an EOM according to another exemplary embodiment. Referring to FIGS. 1 to 14, an operation method of an EOM may be as follows.

In step S210, an EOM 120b (refer to FIG. 5) may receive reference voltage data Vref, size information data SZ, and a selection bit SEL_B. A DAC (not shown) of the EOM 120b may receive the reference voltage data Vref, and generate first and second parent reference voltages refp and refn. Turning on/off of each of reference branches RBRs in each of comparators 122-1 and 122-2 (refer to FIG. 5) may be determined according to the size information data SZ. Accordingly, in step S220, a size of each of the comparator 122-1 and 122-2 may be set. Also, in step S220, a phase shift of a clock CLK is determined according to the selection bit SEL_B. Each of the comparators 122-1 and 122-2 may compare difference (INP−INN) between input voltages of a main branch MBR with difference between output voltages of each of reference branches RBRs. Each of sensing amplifiers 123-1 and 123-2 (refer to FIG. 5) may sample a compared result value of corresponding one of the comparators 122-1 and 122-2 in response to the clock CLK. A logic circuit 124 (refer to FIG. 5) may XOR compute output values of the sensing amplifiers 123-1 and 123-2. In step S330, a counter 125a (refer to FIG. 5) may count an output value of the logic circuit 124 until a signal with a level of a predetermined state is output from the logic circuit 124 to output a counted value EOM_CNT.

In the operation method of the EOM according to an exemplary embodiment, resolution of the reference voltage may be enhanced by varying the size of the comparator 122 according to the size information data SZ. In the operation method of the EOM according to another exemplary embodiment, resolution of the phase shift of the clock may be enhanced by including the PI for shifting the phase of the clock according to the selection bit SEL_B and varying the phase.

The EOM according to exemplary embodiments may be applied to a peripheral component interconnect express (PCIe) interface for performing data communication.

Figure 15:
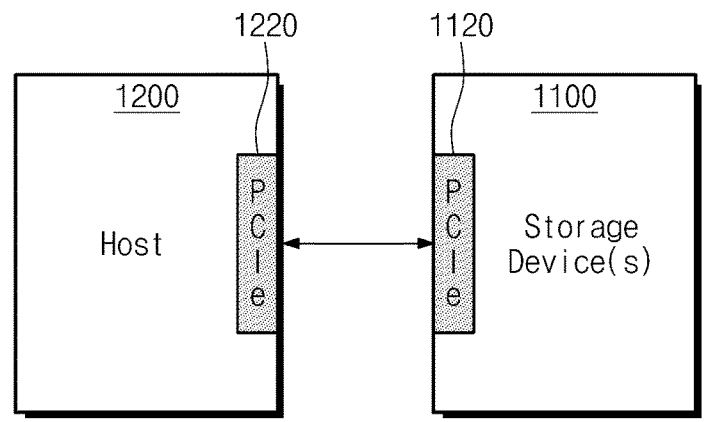
FIG. 15 is a block diagram illustrating a configuration of an electronic device according to an exemplary embodiment.

FIG. 15 is a block diagram illustrating a configuration of an electronic device according to an exemplary embodiment. Referring to FIG. 15, an electronic device 1000 may include at least one storage device 1100 for storing data and a host 1200 for managing the storage device 1100. The host 1200 and the storage device 1100 may communicate with each other according to PCIe interface standard. Herein, each of PCIe interface devices 1120 and 1220 may include an EOM in its device for receiving data.

The EOM according to exemplary embodiments may be applied to any types of interfaces for performing high-speed communication.

Figure 16:
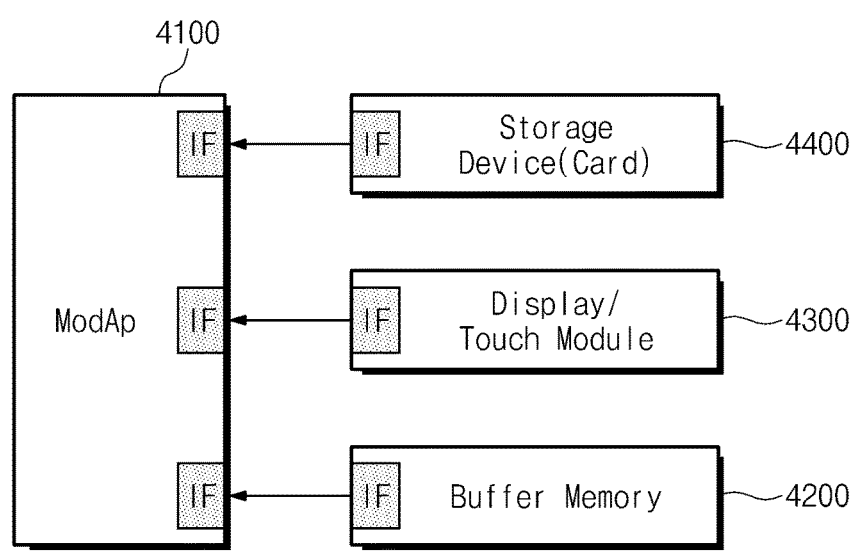
FIG. 16 is a block diagram illustrating a configuration of a mobile device according to an exemplary embodiment.

FIG. 16 is a block diagram illustrating a configuration of a mobile device according to an exemplary embodiment. Referring to FIG. 16, a mobile device 4000 may include an integrated processor 4100 (e.g., a ModAP), a buffer memory 4200, a display/touch module 4300, and a storage device 4400.

The integrated processor 4100 may be implemented to control an overall operation of the mobile device 4000 and to control wired/wireless communication with the outside. The buffer memory 4200 may be implemented to temporarily store data necessary for a processing operation of the mobile device 4000. The display/touch module 4300 may be implemented to display data processed in the integrated processor 4100 or to receive data from a touch panel. The storage device 4400 may be implemented to store data of a user. The storage device 440 may be an embedded multimedia card (eMMC), a solid state disk (SSD), or a universal flash storage (UFS) device.

At least one of an interface (IF) circuit of the buffer memory 4200, an IF circuit of the display/touch module 4300, and an IF circuit of the storage device 4400, which communicates with the integrated processor 4100, may have an EOM shown in FIGS. 1 to 14.

The mobile device 4000 according to an exemplary embodiment may be advantageous to integration by including the EOM which solves a chip size issue while enhancing reliability of a high-speed data signal.

The EOM according to exemplary embodiments may be applied to a receiver, and also applied to all types of devices (e.g., a repeater and a transmitter) which may detect waveforms of analog signals.

As described above, the IC and the SERDES device according to exemplary embodiments may enhance the resolution of the reference voltage without increasing the chip size according to the measurement of the eye diagram by including the EOM which varies the driving capability.

At least one of the components, elements, modules or units represented by a block as illustrated in FIGS. 1, 6-12, 15, and 16 may be embodied as various numbers of hardware, software and/or firmware structures that execute respective functions described above, according to an exemplary embodiment. For example, at least one of these components, elements or units may use a direct circuit structure, such as a memory, processing, logic, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions, and executed by one or more microprocessors or other control apparatuses. Also, at least one of these components, elements or units may further include a processor such as a central processing unit (CPU) that performs the respective functions, a microprocessor, or the like. Two or more of these components, elements or units may be combined into one single component, element or unit which performs all operations or functions of the combined two or more components, elements of units. Also, at least part of functions of at least one of these components, elements or units may be performed by another of these components, element or units. Further, although a bus is not illustrated in the above block diagrams, communication between the components, elements or units may be performed through the bus. Functional aspects of the above exemplary embodiments may be implemented in algorithms that execute on one or more processors. Furthermore, the components, elements or units represented by a block or processing steps may employ any number of related art techniques for electronics configuration, signal processing and/or control, data processing and the like.

The operations or steps of the methods or algorithms described above can be embodied as computer readable codes on a computer readable recording medium, or to be transmitted through a transmission medium. The computer readable recording medium is any data storage device that can store data which can be thereafter read by a computer system. Examples of the computer readable recording medium include read-only memory (ROM), random-access memory (RAM), compact disc (CD)-ROM, digital versatile disc (DVD), magnetic tape, floppy disk, and optical data storage device, not being limited thereto. The transmission medium can include carrier waves transmitted through the Internet or various types of communication channel. The computer readable recording medium can also be distributed over network coupled computer systems so that the computer readable code is stored and executed in a distributed fashion.

While exemplary embodiments have been shown and described with reference to the accompanying drawings, it will be apparent to those skilled in the art that various modifications and variations can be made from the foregoing descriptions without departing from the spirit and scope of the inventive concept. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Therefore, it should be understood that the above exemplary embodiments are not limiting, but illustrative. Thus, the scopes of the inventive concept are to be determined by the broadest permissible interpretation of the following claims and their equivalents, and shall not be restricted or limited by the foregoing description.

What is claimed is:

1. An integrated circuit comprising:
an internal circuit; and
an eye opening monitor (EOM) configured to measure an eye diagram of a predetermined point of the internal circuit,
wherein the EOM comprises a comparator configured to receive a first parent reference voltage and a second parent reference voltage and a first input voltage and a second input voltage from the internal circuit, and to compare the first input voltage and the second input voltage with target reference voltages that are obtained by dividing the first parent reference voltage and the second parent reference voltage according to a driving capability of the comparator,
wherein the driving capability of the comparator is varied according to size information data, and values of the target reference voltages are changed according to the varied driving capability.

2. The integrated circuit of claim 1, wherein the EOM further comprises a digital to analog converter (DAC) configured to receive reference voltage data and to output the first parent reference voltage and the second parent reference voltage to the comparator.

3. The integrated circuit of claim 1, further comprising:
a sensing amplifier configured to sample and amplify an output value of the comparator in response to a clock.

4. The integrated circuit of claim 3, further comprising:
a counter configured to perform counting in response to an output value of the sensing amplifier.

5. The integrated circuit of claim 3, further comprising:
a phase locked loop (PLL) configured to receive a reference clock and to generate the clock,
wherein the PLL comprises a phase interpolator (PI) configured to shift a phase of the clock in response to a selection bit.

6. The integrated circuit of claim 1, wherein the comparator comprises:

a main branch configured to receive the first input voltage and the second input voltage respectively at a first node and a second node; and a plurality of reference branches, each of which configured to provide the first parent reference voltage and the second parent reference voltage respectively to the first node and the second node.

7. The integrated circuit of claim 6, wherein each of the plurality of reference branches is enabled in response to the size information data.

8. The integrated circuit of claim 7, wherein the main branch and the plurality of reference branches are configured such that an amount of current which flows in the main branch is identical to an amount of current which flows in the enabled reference branches among the plurality of reference branches.

9. The integrated circuit of claim 6, wherein at least two reference branches among the plurality of reference branches are implemented with transistors of different sizes.

10. The integrated circuit of claim 1, wherein the comparator comprises a first comparator and a second comparator, wherein each of the first comparator and the second comparator comprises:

a main branch configured to receive the first input voltage and the second input voltage respectively at a first node and a second node, and a plurality of reference branches, each of which configured to provide the first parent reference voltage and the second parent reference voltage respectively to the first node and the second node, wherein each of the plurality of reference branches is enabled in response to the size information data, and wherein the first parent reference voltage and the second parent reference voltage input to the plurality of reference branches of the first comparator and the first parent reference voltage and the second parent reference voltage input to the plurality of reference branches of the second comparator are complementary with each other.

11. The integrated circuit of claim 10, wherein each of the first comparator and the second comparator comprises:

a first multiplexer configured to select one of a supply voltage, a ground voltage, the first parent reference voltage, and the second parent reference voltage, and to provide the selected voltage to the plurality of reference branches; and a second multiplexer configured to select one of the supply voltage, the ground voltage, the first parent reference voltage, and the second parent reference voltage, and to provide the selected voltage to the plurality of reference branches, and wherein the voltage selected by the first multiplexer and the voltage selected by the second multiplexer are complementary with each other.

12. The integrated circuit of claim 10, further comprising:

a first sensing amplifier configured to sample and amplify an output value of the first comparator in response to a clock; and a second sensing amplifier configured to sample and amplify an output value of the second comparator in response to the clock.

13. The integrated circuit of claim 12, further comprising:

a logic circuit configured to exclusive OR (XOR) compute an output value of the first sensing amplifier and an output value of the second sensing amplifier; and a counter configured to count an output value of the logic circuit until the output value of the logic circuit is input as a signal with a level of a predetermined state.

14. The integrated circuit of claim 12, further comprising:

a phase locked loop (PLL) configured to receive a reference clock and generate the clock, wherein the PLL comprises a phase interpolator (PI) configured to shift a phase of the clock in response to a selection bit.

15. An integrated circuit comprising:

a continuous time linear equalizer (CTLE) configured to amplify serial data signals;

a sampler configured to sample a first input voltage and a second input voltage output from the CTLE; and an eye opening monitor (EOM) configured to measure an eye diagram of the first input voltage and the second input voltage, and wherein the EOM comprises:

a digital to analog converter (DAC) configured to receive reference voltage data and output a first parent reference voltage and a second parent reference voltage; and a comparator configured to receive the first parent reference voltage and the second parent reference voltage and the first input voltage and the second input voltage output from the CTLE, and to compare the first input voltage and the second input voltage with target reference voltages that are obtained by dividing the first parent reference voltage and the second parent reference voltage according to a driving capability of the comparator, wherein the driving capability of the comparator is varied according to size information data, and values of the target reference voltages are changed according to the varied driving capability.

16. The integrated circuit of claim 15, further comprising:

a decision feedback equalizer (DFE) configured to connect between the CTLE and the sampler.

17. The integrated circuit of claim 16, further comprising:

a first buffer configured to output voltages between the CTLE and the DFE as input voltages of the EOM in response to a first enable signal; and a second buffer configured to output voltages between the DFE and the sampler as input voltages of the EOM in response to a second enable signal, wherein the first enable signal and the second enable signal are complementary with each other.

18. The integrated circuit of claim 16, further comprising:

a clock and data recovery (CDR) circuit configured to reproduce data and a clock output from the sampler.

19. A serializer/deserializer (SERDES) device comprising:

a receiver configured to receive reception signals and to output parallel reception data in response to a clock;

a transmitter configured to receive parallel transmission data in response to the clock and to output transmission signals; and a phase locked loop (PLL) configured to receive a reference clock and generate the clock, wherein the receiver comprises an eye opening monitor (EOM) configured to detect waveforms of the reception signals, wherein the EOM comprises:

a digital to analog converter (DAC) configured to receive reference voltage data and output a first parent reference voltage and a second parent reference voltage; and a comparator configured to receive the first parent reference voltage and the second parent reference voltage and a first input voltage and a second input voltage, and to compare the first input voltage and the second input voltage with target reference voltages that are obtained by dividing the first parent reference voltage and the second parent reference voltage according to a driving capability of the comparator, wherein the driving capability of the comparator is varied according to size information data, and values of the target reference voltages are changed according to the varied driving capability.

20. The SERDES device of claim 19, wherein the receiver further comprises:
- an analog front end (AFE) circuit configured to receive and amplify the reception signals;
- a decision feedback equalizer (DFE) configured to equalize output signals of the AFE circuit;
- a clock and data recovery (CDR) circuit configured to reproduce data and a clock output from the DFE; and
- a deserializer (DES) configured to receive the data and output the parallel reception data in response to the clock.

* * * * *